US009711682B2

United States Patent
Han et al.

(10) Patent No.: US 9,711,682 B2
(45) Date of Patent: Jul. 18, 2017

(54) MULTIPLE QUANTUM WELL LIGHT EMITTING DEVICE WITH MULTI-LAYER BARRIER STRUCTURE

(71) Applicant: LG INNOTEK CO., LTD., Seoul (KR)

(72) Inventors: Young Hun Han, Seoul (KR); Rak Jun Choi, Seoul (KR); Jeong Tak Oh, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 156 days.

(21) Appl. No.: 13/969,811

(22) Filed: Aug. 19, 2013

(65) Prior Publication Data
US 2014/0054542 A1 Feb. 27, 2014

(30) Foreign Application Priority Data
Aug. 23, 2012 (KR) .................. 10-2012-0092622

(51) Int. Cl.
*H01L 33/12* (2010.01)
*H01L 33/06* (2010.01)
*H01L 33/32* (2010.01)

(52) U.S. Cl.
CPC ............. *H01L 33/12* (2013.01); *H01L 33/06* (2013.01); *H01L 33/32* (2013.01); *H01L 2224/48091* (2013.01)

(58) Field of Classification Search
CPC ......... H01L 33/06; H01L 33/12; H01L 33/32
See application file for complete search history.

(56) References Cited

U.S. PATENT DOCUMENTS

2001/0002048 A1* 5/2001 Koike .................... B82Y 20/00
257/80
2002/0074542 A1* 6/2002 Gunapala ............... B82Y 20/00
257/14
(Continued)

FOREIGN PATENT DOCUMENTS

CN 102456795 A 5/2012
JP 2000-091708 3/2000
(Continued)

OTHER PUBLICATIONS

Chinese Office Action dated Oct. 8, 2015 issued in Application No. 201310367268.4.
(Continued)

*Primary Examiner* — Matthew Landau
*Assistant Examiner* — Mark Hatzilambrou
(74) *Attorney, Agent, or Firm* — KED & Associates, LLP

(57) ABSTRACT

The light emitting device includes a first conductive semiconductor layer; a second conductive semiconductor layer on the first conductive semiconductor layer; and an active layer between the first and second conductive semiconductor layers. The active layer includes a plurality of well layers and a plurality of barrier layers, wherein the well layers include a first well layer and a second well layer adjacent to the first well layer. The barrier layers include a first barrier layer disposed between the first and second well layers, and the first barrier layer includes a plurality of semiconductor layers having an energy bandgap wider than an energy bandgap of the first well layer. At least two layers of the plurality of semiconductor layers are adjacent to the first and second well layers, and have aluminum contents greater than that of the other layer.

17 Claims, 11 Drawing Sheets

(56) References Cited

U.S. PATENT DOCUMENTS

| | | | |
|---|---|---|---|
| 2004/0256611 A1 | 12/2004 | Kim et al. | 257/13 |
| 2008/0217632 A1* | 9/2008 | Tomiya | B82Y 20/00 |
| | | | 257/96 |
| 2009/0090901 A1* | 4/2009 | Kim | H01L 33/12 |
| | | | 257/13 |
| 2010/0059734 A1 | 3/2010 | Kaneko et al. | |
| 2010/0219395 A1 | 9/2010 | Hirayama et al. | |
| 2011/0037049 A1 | 2/2011 | Tachibana et al. | |
| 2011/0254048 A1 | 10/2011 | Amano et al. | |
| 2012/0187366 A1 | 7/2012 | Yoon et al. | |

FOREIGN PATENT DOCUMENTS

| | | |
|---|---|---|
| JP | 2001-160627 | 6/2001 |
| JP | 2005-012216 A | 1/2005 |
| JP | 2007-515791 | 6/2007 |
| JP | 2010-067709 | 3/2010 |
| JP | 2010-205767 | 9/2010 |
| WO | WO 2005/020396 A1 | 3/2005 |
| WO | WO 2007/005984 A1 | 1/2007 |
| WO | WO 2009/020235 | 2/2009 |
| WO | WO 2011/021264 | 2/2011 |

OTHER PUBLICATIONS

Japan Office Action dated Jun. 24, 2014 issued in Application No. 2013-165833.
Japanese Office Action dated Apr. 25, 2017 issued in Application No. 2015-106398.

* cited by examiner

MULTIPLE QUANTUM WELL LIGHT EMITTING DEVICE WITH MULTI-LAYER BARRIER STRUCTURE

The present application claims priority under 35 U.S.C. §119(a) of Korean Patent Application No. 10-2012-0092622 filed on Aug. 23, 2012, which is hereby incorporated by reference in its entirety.

BACKGROUND

The embodiment relates to a light emitting device, a method of fabricating the same, and a light emitting device package.

An LED (Light Emitting Device) is a device to convert electrical energy into light energy. Recently, the LED has been improved in luminance, so that the LED has been extensively used as a light source for a display device, a vehicle or a lighting device.

Recently, a high-power light emitting chip, which generates short-wavelength light such as blue or green light to achieve a full color, has been developed. Thus, a light emitting diode capable of emitting light having various colors can be achieved or a light emitting diode capable of emitting white light can be implemented by coating a phosphor, which partially absorbs light emitted from a light emitting chip to output light having a different wavelength, on the light emitting chip.

The above references are incorporated by reference herein where appropriate for appropriate teachings of additional or alternative details, features and/or technical background.

SUMMARY

The embodiment provides a light emitting device including barrier layers which are disposed between well layers of an active layer and each of the barrier layers which has a plurality of barrier structures.

The embodiment provides a light emitting device including a barrier layer which has at least three barrier structures between adjacent well layers in an active layer.

The embodiment provides a light emitting device including a barrier layer which has a thickness thinner than that of a well layer of an active layer and which has a plurality of barrier structures having an energy bandgap wider than that of a ternary compound semiconductor.

The embodiment provides a light emitting device including an active layer provided with a first semiconductor layer having a first energy bandgap and second and third semiconductor layers having a second energy bandgap wider than the first energy bandgap and disposed on top and bottom surfaces of the first semiconductor, respectively.

The embodiment provides a light emitting device in which at least one of barrier layers in an active layer includes a plurality of layers which include at least two layers adjacent to a well layer having aluminum (Al) contents greater than that of the other layer.

The embodiment provides a light emitting device in which at least one of barrier layers in an active layer includes a plurality of layers which include at least two layers to adjacent to a well layer having thickness thinner than the other layer.

The embodiment provides a light emitting device in which at least one of barrier layers in an active layer includes a plurality of layers, of which thicknesses of the layers adjacent to well layers are thinner than a thickness of the well layer.

The embodiment provides a light emitting device in which at least one of barrier layers in an active layer includes a plurality of layers which include at least two layers to adjacent to a well layer having energy bandgaps wider than that of the other layer.

The embodiment provides a light emitting device in which at least one of barrier layers in an active layer includes a plurality of layers which include at least two layers to adjacent to a well layer having a barrier height higher than that of the other layer.

The embodiment provides a light emitting device in which at least one of barrier layers in an active layer includes a plurality of layers which include at least two layers to adjacent to a well layer having lattice constants smaller than that of the other layer.

According to the embodiment, there is provided a light emitting device including: a first conductive semiconductor layer; a second conductive semiconductor layer on the first conductive semiconductor layer; and an active layer between the first and second conductive semiconductor layers, the active layer including a plurality of well layers and a plurality of barrier layers, wherein the well layers comprise a first well layer and a second well layer adjacent to the first well layer, the barrier layers comprise a first barrier layer disposed between the first and second well layers, the first barrier layer comprises a plurality of semiconductor layers having an energy bandgap wider than an energy bandgap of the first well layer, and at least two layers of the plurality of semiconductor layers which is adjacent to the first and second well layers have aluminum contents greater than that of the other layer.

According to the embodiment, there is provided a light emitting device including: a first conductive semiconductor layer including an n type dopant; a second conductive semiconductor layer on the first conductive semiconductor layer, the second conductive semiconductor layer including an p type dopant; an active layer between the first and second conductive semiconductor layers, the active layer including a plurality of well layers and a plurality of barrier layers; and an electron blocking layer between the active layer and the second conductive semiconductor layer, wherein the well layers comprise a first well layer and a second well layer adjacent to the first well layer, the barrier layers comprise a first barrier layer disposed between the first and second well layers, the first barrier layer comprises a plurality of semiconductor layers having an energy bandgap wider than an energy bandgap of the first well layer, and at least two layers of the plurality of semiconductor layers which is adjacent to the first and second well layers have lattice constants smaller than that of the other layer, and the at least two layers have aluminum contents greater than that of the other layer.

BRIEF DESCRIPTION OF THE DRAWINGS

The embodiments will be described in detail with reference to the following drawings in which like reference numerals refer to like elements wherein.

DETAILED DESCRIPTION OF THE EMBODIMENTS

Figure 1:
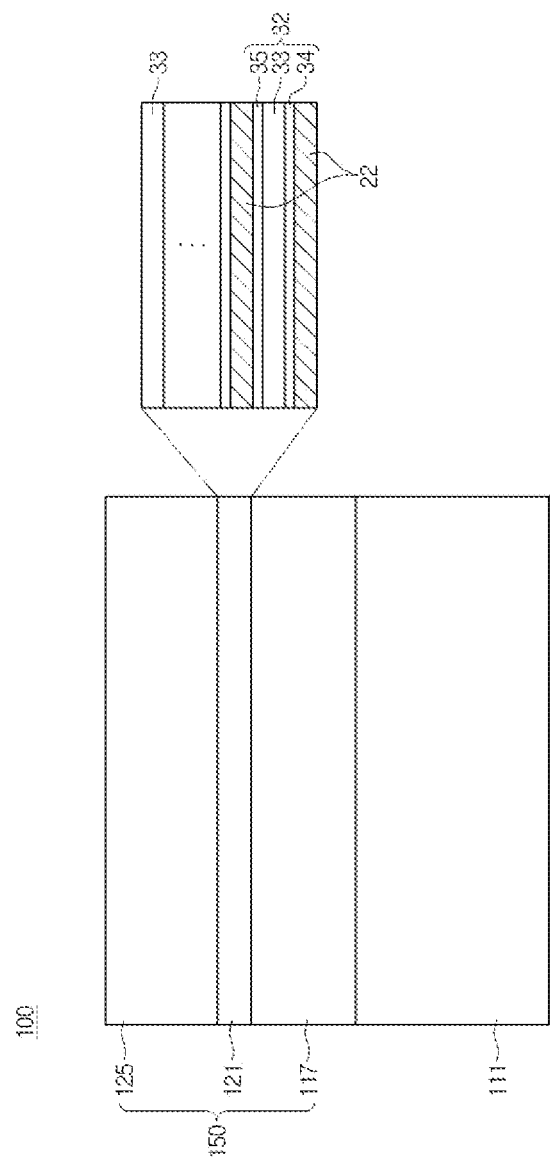
FIG. 1 is a side sectional view illustrating a light emitting device according to the first embodiment.

Hereinafter, embodiments will be described in detail with reference to accompanying drawings. In the description of the embodiments, it will be understood that when a layer (film), an area, a pattern, or a structure is referred to as being "on" or "under" another layer (film), another area, another pad or another pattern, it can be "directly" or "indirectly" on the other layer (film), the other area, the other pattern may also be present. Such a position of the layer has been described with reference to the drawings. The thickness and size of each layer shown in the drawings may be exaggerated, omitted or schematically drawn for the purpose of convenience or clarity. In addition, the size of the elements does not utterly reflect an actual size.

FIG. 1 is a sectional view of a light emitting device according to the first embodiment.

Referring to FIG. 1, the light emitting device 100 may include a substrate 111, a first conductive semiconductor layer 117, an active layer 121, and a second conductive semiconductor layer 125.

The substrate 111 may include a transmissive substrate, an insulation substrate or a conductive substrate. For instance, the substrate 111 may include at least one of $Al_2O_3$, SiC, Si, GaAs, GaN, ZnO, Si, GaP, InP, Ge, $Ga_2O_3$ and $LiGaO_3$. A plurality of protrusions may be formed on a top surface of the substrate 111. The protrusion can be formed by etching the substrate 111 or in a separate light extracting structure. The protrusion may be formed in a shape of a stripe, a hemisphere or a dome. The substrate 111 may have a thickness in the range of 30 μm to 250 μm, but the embodiment is not limited thereto.

A plurality of compound semiconductor layers may be grown on the substrate 111. The compound semiconductor layers may be formed by using at least one of group II-VI and group III-V compound semiconductors. At least one of the compound semiconductor layers may include at least one of GaN, InN, AlN, InGaN, AlGaN, InAlGaN, AlInN, AlGaAs, GaP, GaAs, GaAsP, and AlGaInP.

The compound semiconductor layers may be grown by using the following equipment. For example, the growing equipment includes an E-beam evaporator, PVD (physical vapor deposition), CVD (chemical vapor deposition), PLD (plasma laser deposition), a dual-type thermal evaporator, sputtering, or MOCVD (metal organic chemical vapor deposition), but the embodiment is not limited thereto.

The first conductive semiconductor layer 117 may be formed on the substrate 111. The first conductive semiconductor layer 117 may make contact with the substrate 111 and may be formed on another layer. The first conductive semiconductor layer 117 may include at least one of group II to VI compound semiconductor and group III to V compound semiconductors doped with a first conductive dopant. For example, the first conductive semiconductor layer 117 may be formed of the semiconductor material having the compositional formula of $In_xAl_yGa_{1-x-y}N$ ($0 \leq x \leq 1$, $0 \leq y \leq 1$, $0 \leq x+y \leq 1$). For example, the first conductive semiconductor layer 117 includes at least one of GaN, InN, AlN, InGaN, AlGaN, InAlGaN, AlInN, AlGaAs, GaP, GaAs, GaAsP and AlGaInP. The first conductive semiconductor layer 117 includes an n type semiconductor layer and the first conductive dopant is an n type dopant including Si, Ge, Sn, Se or Te.

At least one semiconductor layer may be disposed between the substrate 111 and the first conductive semiconductor layer 117, but the embodiment is not limited thereto.

The active layer 121 is provided on the first conductive semiconductor layer 117. The active layer 121 may emit the light having the wavelength band in the range of a visible ray band to an ultraviolet ray band. For example, the active layer 121 according to the embodiment emits the light having a wavelength of 400 nm or less. For example, the active layer 121 may emit the light having a wavelength in the range of 285 nm to 385 nm.

The active layer 121 is formed on the first conductive semiconductor layer 117. The active layer 121 may be formed in at least one of a single well structure, a single quantum well structure, a multiple well structure, a multiple quantum well (MQW) structure, a quantum dot structure, and a quantum wire structure.

The active layer 121 includes the plurality of well layers 22, a plurality of barrier layers 32, and includes the structure of multiple wells. The active layer 121 includes pairs of well/barrier layers which are alternatively disposed. The active layer 121 emits the light having a wavelength of an ultraviolet ray range. The active layer 121 emits the light in the wavelength band of 400 nm or less, for example, in the wavelength range of 385 nm to 285 nm.

The number of pairs of the well and barrier layers 22 and 32 may be in the range of 20 to 30. The well layer 22 may be defined as a quantum well layer and the barrier layer 32 may be defined as a quantum barrier layer.

For example, the well layer 22 may be formed of the semiconductor material having the compositional formula of $In_xAl_yGa_{1-x-y}N$ ($0 \leq x \leq 1$, $0 \leq y \leq 1$, $0 \leq x+y \leq 1$). For example, the well layer 22 may be formed of InGaN, GaN or AlGaN. The barrier layer 32 may be formed of a semiconductor material having a bandgap wider than that of the well layer 22. For example, the barrier layer 32 may be formed of one selected from semiconductor materials having the compositional formula of $In_xAl_yGa_{1-x-y}N$ ($0 \leq x \leq 1$, $0 \leq y \leq 1$, $0 \leq x+y \leq 1$). For example, the barrier layer 32 may be formed of $Al_yGa_{1-y}N$ ($0 < y \leq 1$). The barrier layer 32 may be disposed between adjacent well layers 22.

Each of the barrier layers 32 adjacent to the well layers 22 may include a structure of barrier layers which have energy bandgaps wider than those of the well layers 22.

Each of the barrier layers 32 is disposed between the well layers 22 and includes a plurality layers, for example, three semiconductor layers 33, 34 and 35 or more. The energy bandgaps of at least two layers 34 and 35 adjacent to the well layers 22 in each of the barrier layers 32 are wider than that of the other layer 33. The at least two layers 34 and 35 adjacent to the well layers 22 in each of the barrier layers 32 may have aluminum contents greater than that of the other layer 33. The thicknesses of the at least two layers 34 and 35 adjacent to the well layers 22 in each of the barrier layers 32 are thinner than that of the other layer 33. The thicknesses of the at least two layers 34 and 35 adjacent to the well layers 22 in each of the barrier layers 32 may be thinner than thicknesses of the well layers 22. The thicknesses of the at least two layers 34 and 35 adjacent to the well layers 22 may be equal to each other. The barrier heights of the at least two layers 34 and 35 may be higher than that of the other layer 33 and the lattice constants of the at least two layers 34 and 35 adjacent to the well layers 22 in each of the barrier layers 32 may be smaller than that of the other layer 33.

Each of the barrier layers 32 is disposed between the well layers 22. Each of the barrier layers 32 includes a first semiconductor layer 33, a second semiconductor layer 34 contacted with a bottom surface of the first semiconductor layer 33, and a third semiconductor layer 35 contacted with a top surface of the first semiconductor layer 33.

The first semiconductor layer 33 is formed of a ternary or quaternary compound semiconductor material including Al, and is disposed between the second and third semiconductor layers 34 and 35. The second semiconductor layer 34 includes a binary compound semiconductor having Al and the third semiconductor layer 35 includes a binary compound semiconductor having Al. For example, the binary, ternary or quaternary compound semiconductor may be formed by combining a ternary metallic material and nitrogen (N). The ternary metallic material includes a material such as In, Al, or Ga.

Further, the first semiconductor layer 33 has a second energy bandgap wider than a first energy bandgap of the well layer 22, and the second and third semiconductor layers 34 and 35 have a third energy bandgap wider than the second energy bandgap.

The first semiconductor layer 33 may be formed of a ternary or quaternary compound semiconductor having Al and N. For example, the first semiconductor layer 33 may be formed of AlGaN or InAlGaN.

The second semiconductor layer 34 may be formed of a binary compound semiconductor having Al and N. For example, the second semiconductor layer 34 may be formed of AlN. The third semiconductor layer 35 may be formed of a binary compound semiconductor having Al and N. For example, the third semiconductor layer 34 may be formed of AlN. The second and third semiconductor layers 34 and 35 may be formed of AlN and the energy bandgaps of the second and third semiconductor layers 34 and 35 may be equal to each other.

The first to third semiconductors 33, 34 and 35 in the barrier layer 32 may be stacked in the order of the second semiconductor 34, the first semiconductor 33 and the third semiconductor 35. For example, the barrier layer 32 may be stacked in the structure of AlN/AlGaN/AlN or AlN/InAlGaN/AlN.

The pair structure of the well layer 22 and the barrier layer 32 may include one of InGaN/AlN/AlGaN/AlN, InGaN/ AlN/InAlGaN/AlN, GaN/AlN/AlGaN/AlN, and GaN/AlN/ InAlGaN/AlN. Refer to the description explained below for the details of the active layer 121.

A third barrier layer, which is the closest to the second conductive semiconductor layer 125 among the plurality of barrier layers 32, includes the first semiconductor layer 33 having the second energy bandgap, and has a single barrier structure or a plurality of barrier structures. The third barrier layer may include a structure of a single layer or a plurality of layers, but the embodiment is not limited thereto. The first semiconductor layer 33 may be formed of AlGaN.

As another embodiment, the third barrier layer, which is the closest to the second conductive semiconductor layer 125, may include at least one of the first to third semiconductor layers 33, 34 and 35. For example, the third barrier layer may be formed in the stack structure of AlN/AlGaN, but the embodiment is not limited thereto.

For example, the active layer 121 may be grown by forming the well layer 22 including GaN or InGaN and the barrier layer 32 including AlN and AlGaN by selectively supplying $NH_3$, TMGa (or TEGa), TMIn, and TMAl as the source using the carrier gas of $H_2$ or/and $N_2$ at the predetermined growing temperature (For example: 700-950° C.).

The second conductive semiconductor layer 125 is disposed on the active layer 121 and includes the second conductive dopant. The second conductive semiconductor layer 125 may include a stack structure of layers including at least one of the compound semiconductors such as GaN, InN, AlN, InGaN, AlGaN, InAlGaN, AlInN, AlGaAs, GaP, GaAs, GaAsP, and AlGaInP. The second conductive semiconductor layer 125 may include a p-type semiconductor layer, and the second conductive dopant, which is a p-type dopant, may include Mg, Zn, Ca, Sr and Ba. The second conductive semiconductor layer 125 may make contact or non-contact with at least one of layers constituting the last barrier layer of the active layer 121.

The conductive types of the layers in the light emitting structure layer may be changed inversely to the above. For example, the second conductive semiconductor layer 125 may be prepared as the n type semiconductor layer and the first conductive semiconductor layer 117 may be prepared as the p type semiconductor layer. In addition, an n type semiconductor layer, which is a third conductive semiconductor layer having polarity opposite to that of the second conductive semiconductor layer 25, can be further formed on the second conductive semiconductor layer 125. The light emitting device 100 may be defined as the light emitting structure including the first conductive semiconductor layer 117, the active layer 121 and the second conductive semiconductor layer 125. The light emitting structure 150 may have one of an n-p junction structure, a p-n junction structure, an n-p-n junction structure, and a p-n-p junction structure. In the case of the n-p and p-n junction structures, the active layer 121 is disposed between two layers. In the case of the n-p-n and p-n-p junction structures, at least one active layer 121 is disposed among three layers.

Figure 2:
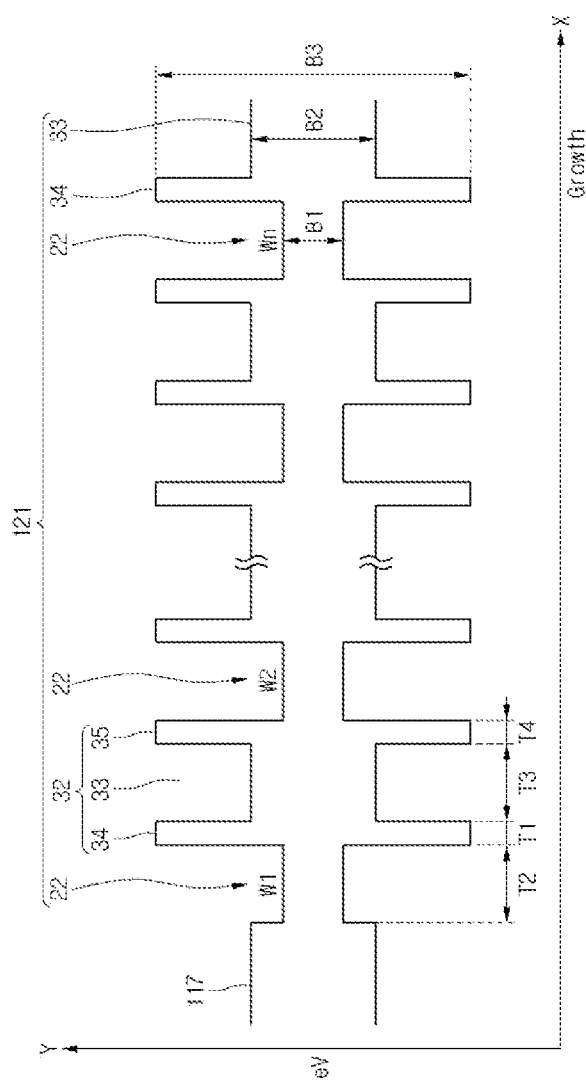
FIG. 2 is an energy band diagram of the active layer shown in the FIG. 1.
Figure 3:
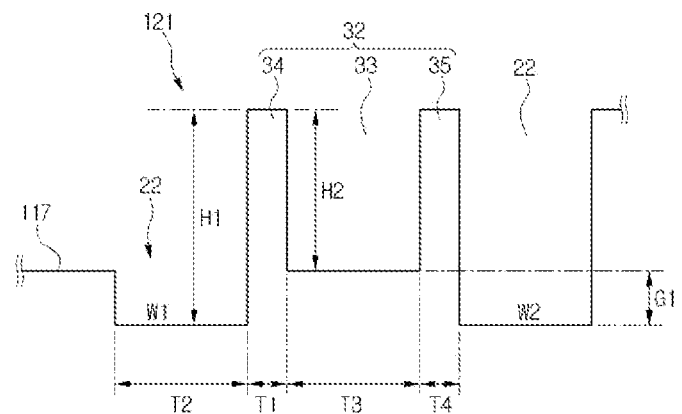
FIG. 3 is a detailed view showing a first well layer and a first barrier layer of an active layer shown in FIG. 2.

FIG. 2 is an energy band diagram of the active layer in FIG. 1. In FIG. 2, the vertical axis Y denotes an absolute value (eV) of an energy bandgap and the horizontal axis X denotes a growing direction. FIG. 3 is a view showing in detail the first well layer and the first barrier layer of the active layer in FIG. 2.

Referring to FIGS. 1 to 3, the active layer 121 includes the plurality of well layers 22 and the plurality of barrier layers 32, and emits the light having a wavelength of 400 nm or less. For example, the active layer 121 may emit the light having a wavelength in the range of 285 nm to 385 nm. For example, the range of the light emitting wavelength of the active layer 121 is generated by a difference between the energy bandgaps of the well layer 22 and the first semiconductor layer 33 of the barrier layer 32. That is the first semiconductor layer 33 of the barrier layer 32 is a main barrier layer, and the second and third semiconductor layers 34 and 35 serve as electron barrier layers.

For example, the well layer 22 may be formed of InGaN, GaN or AlGaN. For the purpose of convenience of explanation, the first and second well layers W1 and W2 among the plurality of well layers 22 may be adjacent to each other. For the purpose of convenience of explanation, the first well layer W1 may be adjacent to the first conductive semiconductor layer 117 and the second well layer W2 may be adjacent to the first well layer W1. In addition, the third well layer Wn may be defined as the well layer which is the nearest to the second conductive semiconductor layer 125 among the well layers 22. Hereinafter, the description about the plurality of well layers 22 will refer to the descriptions about the first to third well layers W1, W2 and W3.

Each of the barrier layer 32 may be disposed between the first and third well layers W1 and Wn and may make contact with the well layers 22. The barrier layers, which are adjacent to each other in the barrier layer 32, may be defined as the first and second barrier layers, and a barrier layer adjacent to the second conductive semiconductor layer 125 may be defined as the third barrier layer.

The barrier layer 32 includes the first to third semiconductor layers 33, 34 and 35. The third barrier layer (for example, the last barrier layer) disposed between the third well layer Wn and the second conductive semiconductor layer 125 includes the first and second semiconductor layers 33 and 34.

The first semiconductor layer 33 is disposed between the second and third semiconductor layers 34 and 35, and the first semiconductor layer 33 makes non-contact with the first and second well layers W1 and W2. The second semiconductor layer 34 is disposed between the first well layer W1 and the first semiconductor layer 33, and the second semiconductor layer 34 may makes contact with a top surface of the first well layer W1 and the bottom surface of the first semiconductor layer 33. The third semiconductor layer 35 may make contact with a bottom surface of the second well layer W2 and the top surface of the first semiconductor layer 33. The first, second and third semiconductor layers 33, 34 35 may be stacked in the order of the second semiconductor layer 34, the first semiconductor layer 33 and the third semiconductor layer 35.

The first semiconductor layer 33 may be formed of a ternary or quaternary compound semiconductor. For example, the first semiconductor layer 33 may be formed of AlGaN or InAlGaN.

The second semiconductor layer 34 may be formed of a binary compound semiconductor including Al. For example, the second semiconductor layer 34 may be formed of AlN. The third semiconductor layer 35 may be formed of a binary compound semiconductor including Al. For example, the third semiconductor layer 35 may be formed of AlN.

The energy gaps B2 and B3 of the first, second and third semiconductor layers 33, 34 35 are wider than the first energy bandgap B1 of the well layer 22. The third energy bandgap B3 of the second semiconductor layer 34 is wider than the second energy bandgap B2 of the first semiconductor layer 33. The first and third semiconductor layers 33 and 35 may have the third energy bandgap B3.

The energy bandgap B3 of the second and third semiconductor layers 34 and 35 adjacent to the well layers W1 and W2 are wider than that of the first semiconductor layer 33. The Al contents of the second and third semiconductor layers 34 and 35 adjacent to the well layers W1 and W2 are greater than that of the first semiconductor layer 33. For example, the second and third semiconductor layers 34 and 35 are disposed closer the first and second well layers W1 and W2 than the first semiconductor layer 33 and have Al contents greater than that of the first semiconductor layer 33. For example, except for N, the Al content among the composition ratios of the first semiconductor layer 33 may be in the range of 5% to 30%, for instance, 5% to 10%. The composition ratio of indium (In) of the well layer 22 except for N may be in the range of 1% to 15. For example, the well layer 22 may have the indium (In) composition ratio in the range of 1% to 5%.

As shown in FIG. 3, the barrier height H1 of the second and third semiconductor layers 34 and 35 adjacent to the first and second well layers W1 and W2 may have a higher than a barrier height H2 of the first semiconductor layer 33. Since the barrier height H1 of the second and third semiconductor layers 34 and 35 is higher than the barrier height H2 of the first semiconductor layer 33 by a predetermined gap G1, the barrier layer 32 may performs the function of an electron barrier. Since the second and third semiconductor layers 34 and 35 including an AlN material are provided on both side surfaces of the well layer 22, that is, the top and bottom surfaces of the second well layer W2, the barrier height H2 of the first semiconductor layer 33 is not increased and the Al content of the first semiconductor layer 33 may be reduced. Thus, the Al content of the first semiconductor layer 33 in the barrier layer 32 optically coupled with the well layer 22 is reduced so that the quality of the barrier layer 32 may be prevented from being deteriorated.

The thicknesses T1 and T4 of the second and third semiconductor layers 34 and 35 adjacent to the first and second well layers W1 and W2 in each of the barrier layer 32 are thinner than a thickness T3 of the first semiconductor layer 33. The second and third semiconductor layers 34 and 35 may have the thickness T1 and T4 thinner than that T3 of the first semiconductor layer 33 and those T2 of the first and second well layers W1 and W2. The difference between the thicknesses of the second semiconductor layer 34 and the first well layer W1 may be less than that between the thicknesses of the first and second semiconductor layers 33 and 34.

The second and third semiconductor layers 34 and 35 may have the thickness T1 and T4 thinner than that T3 of the first semiconductor layer 33 and those T2 of the first and second well layers W1 and W2. The thicknesses of T2 of the first and second well layers W1 and W2 may be in the range of 1.5 nm to 5 nm, for example in the range of 2 nm to 4 nm. The thickness T3 of the first semiconductor layer 33, which is thicker than those T2 of the first and second well layers W1 and W2, may be in the range of 4 nm to 30 nm, for example, in the range of 4 nm to 6 nm. The thicknesses T1 and T4 of the second and third semiconductor layers 34 and 35 may be equal to each other and for example, in the range of 1 nm to 4 nm. Since the barrier height H2 of the first semiconductor layer 33 for confining carriers, for example, electrons, are lowered, the thickness of the first semiconductor layer 33 may be formed to be thinner. Further, since the electron confinement by the barrier layer 32 adjacent to the first conductive semiconductor layer 117 may be enhanced, the internal quantum efficiency of the active layer 121 may be improved. That is, the barrier layer 32 adjacent to the first conductive semiconductor layer 117 blocks the electrons transferred through the first conductive semiconductor layer 117, so that the radiative recombination may be improved in the entire region of the active layer 121. Thus, the internal quantum efficiency may be improved.

The lattice constants of the second and third semiconductor layers 34 and 35 adjacent to the first and second well layers W1 and W2 in each of the barrier layer 32 are smaller than that of the firstthird semiconductor layers 33. The second and third semiconductor layers 34 and 35 have the lattice constants less than that of the first semiconductor layer 33. Thus, the lattice mismatch between the barrier and well layers 32 and 22 may be reduced. In more detail, the second and third semiconductor layers 34 and 35 may be formed of AlN and the first semiconductor layer 33 may be formed of AlGaN. Since the second and third semiconductor layers 34 and 35 including AlN have the lattice constants less than that of the first semiconductor layer 33 of AlGaN, the polarization in the active layer 121 may be reduced. Further, the crystalline of the interfacial surface between the well layer 22 and the second and third semiconductor layers 34 and 35 may be improved.

The second semiconductor layer 34 of the first barrier layer is disposed on the top surface of the first well layer W1 and the third semiconductor layer 35 of the second barrier layer is disposed on the bottom surface of the second well layer W2. The third semiconductor layer 35 is disposed on the bottom surface of the second well layer W2 and the second semiconductor layer 34 is disposed on the top surface of the second well layer W2, so that the barrier height of the well layer 32 may be increased.

The active layer 121 increases the composition ratio in the quantum well structure, so that the barrier height may be increased by the second and third semiconductor layer 34 and 35 of AlN even if the barrier height of the AlGaN barrier layer is not increased. Thus, the carriers from the first conductive semiconductor layer 117 may be confined. In addition, the deterioration of the barrier quality due to the increasing of the composition ratio of Al in the first semiconductor layer 33 of AlGaN may be prevented.

Since the second and third semiconductor layers 34 and 35 block electrons at both sides of the well layer 22, the recombination rate of electrons and holes in the entire region of the active layer 121 may be increased.

When the light emitted from the active layer 121 is near 285 nm, the well layer 22 may be formed of a binary compound semiconductor including Al such as AlGaN. At least one of the first to third semiconductor layers 33 to 25 of the barrier layer 32 of the barrier layer 32 may include n-type dopants, but the embodiment is not limited thereto. The energy bandgap of the well layer 22 may vary according to a peak wavelength of the ultraviolet ray or a material thereof.

As another example, at least one of the first to third semiconductor layers 33 to 35 may be disposed the most closely to the first conductive semiconductor layer 117, but the embodiment is not limited thereto. The first embodiment is one example that allows the first well layer W1 to be disposed the most closely to the first conductive semiconductor layer 117.

Further, an electron blocking layer (not shown) may be disposed between the second conductive semiconductor layer 125 and the active layer 121, and may include AlGaN, AlN or InAlGaN.

Figure 4:
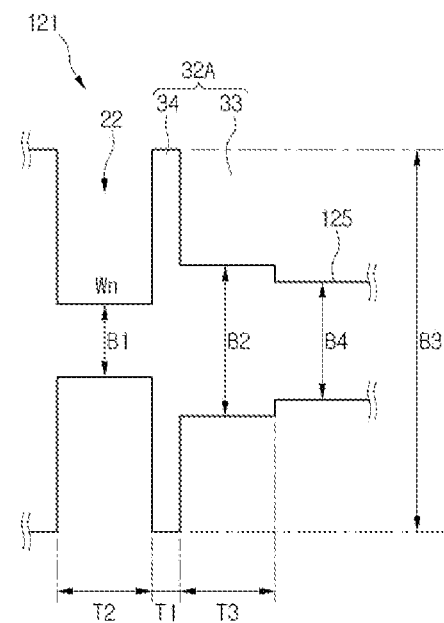
FIG. 4 is an energy band diagram of the last barrier layer of an active layer and the second conductive semiconductor layer shown FIG. 2 according to the first example.

FIG. 4 is an energy band diagram according to the first example of the last barrier layer of active layer and the second conductive semiconductor layer in FIG. 2.

Referring to FIG. 4, the third barrier layer 32A, which is disposed between the second conductive semiconductor layer 125 and the third well layer Wn which is the last well layer of the active layer 121, may include the first and second semiconductor layers 33 and 34. The first semiconductor layer 33 may be disposed more closely to the second conductive semiconductor layer 125 rather than the second semiconductor layer 34, and the second semiconductor layer 34 may make contact with the top surface of the third well layer Wn.

The energy bandgap B4 of the second conductive semiconductor layer 125 may be wider than the first energy bandgap B1 of the third well layer Wn and may be narrower than the second energy bandgap B2 of the first semiconductor layer 33. For example, the second conductive semiconductor layer 125 may be formed of a GaN or AlGaN semiconductor.

Further, an electron blocking layer (not shown) may be disposed between the second conductive semiconductor layer 125 and the active layer 121. The electron blocking layer may include AlN, AlGaN or InAlGaN.

The third barrier layer 32A, which is disposed between the third well layer Wn and the second conductive semiconductor layer 125, may be prepared as two layers instead of three layers, and the third semiconductor layer may be removed. By removing the third semiconductor layer, the hole-injection efficiency may be improved.

Figure 5:
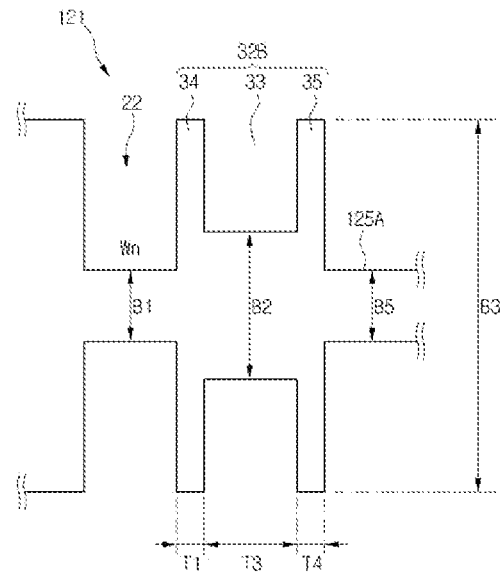
FIG. 5 is an energy band diagram of the last barrier layer of an active layer and the second conductive semiconductor layer shown in FIG. 2 according to the second example.

FIG. 5 is an energy band diagram according to the second example of the last barrier layer of active layer and the second conductive semiconductor layer in FIG. 2.

Referring to FIG. 5, the third barrier layer 32B, which is disposed between the second conductive semiconductor layer 125A and the third well layer Wn which is the last well layer of the active layer 121, may include the first to third semiconductor layers 33 to 35. The first semiconductor layer 33 may be disposed between the second and third semiconductor layers 34 and 35, and the third semiconductor layer 35 may make contact with the bottom surface of the second conductive semiconductor layer 125A.

The energy bandgap B5 of the second conductive semiconductor layer 125A may be equal to or wider than the first energy bandgap B1 of the third well layer Wn, and may be narrower than the second energy bandgap B2 of the first semiconductor layer 33. For example, the second conductive semiconductor layer 125A may be formed of an InGaN, GaN or AlGaN semiconductor.

Further, since the third barrier layer 32 B includes the third semiconductor layer 35, an additional electron blocking layer may not be formed between the second conductive semiconductor layer 125A and the active layer 121.

Figure 6:
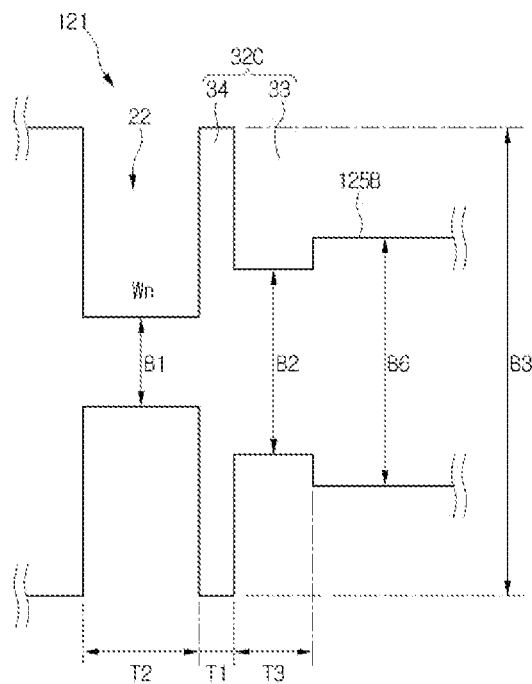
FIG. 6 is an energy band diagram of the last barrier layer of an active layer and the second conductive semiconductor layer shown in FIG. 2 according to the third example.

FIG. 6 is an energy band diagram according to the third example of the last barrier layer of active layer and the second conductive semiconductor layer in FIG. 2.

Referring to FIG. 6, the third barrier layer 32C, which is disposed between the second conductive semiconductor layer 125B and the third well layer Wn of the active layer 121, may include the first and second semiconductor layers 33 and 34. The first semiconductor layer 33 may be disposed more closely to the second conductive semiconductor layer 125B rather than the second semiconductor layer 34, and the second semiconductor layer 34 may make contact with the top surface of the third well layer Wn.

The energy bandgap B6 of the second conductive semiconductor layer 125B may be wider than the first energy bandgap B1 of the third well layer Wn and the second energy bandgap B2 of the first semiconductor layer 33. For example, the second conductive semiconductor layer 125B may be formed of an AlGaN or AlN semiconductor. The second conductive semiconductor layer 125B functions as an electron blocking layer.

The third barrier layer 32C, which is disposed between the third well layer Wn and the second conductive semiconductor layer 125B, may be formed of not three layers but two layers, and the third semiconductor layer may be removed from the barrier layer. By removing the third semiconductor layer, the hole-injection efficiency may be improved.

Figure 7:
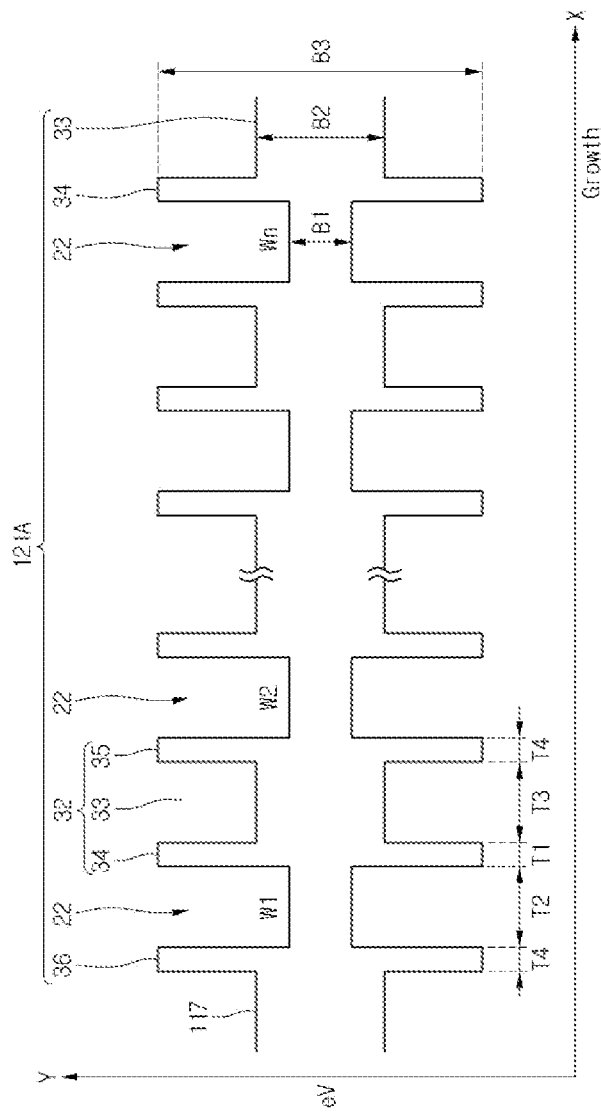
FIG. 7 is an energy band diagram of an active layer according to the second embodiment.

FIG. 7 is an energy band diagram of an active layer according to the second embodiment. In the description of the second embodiment, the description of the first embodiment the same as that of the second embodiment will be incorporated by reference.

Referring to FIG. 7, the active layer 121A is disposed on the first conductive semiconductor layer 117 and the well layer 22 and the barrier layer 32 are alternately disposed. The configurations of the well layer 22 and the barrier layer 32 will refer to the description of an example of the first embodiment.

The active layer 121A may include the fourth semiconductor layer 36, which serves as a barrier layer, between the first well layer W1 of the well layer 22 and the first conductive semiconductor layer 117. The fourth semiconductor layer 36 may make contact with the top surface of the first conductive semiconductor layer 117, and functions as a single barrier structure. The barrier height of the fourth semiconductor layer 36 may be the same as that of the third semiconductor layer 35.

The fourth semiconductor layer 36 may be a binary nitride semiconductor, a ternary nitride semiconductor or more than the ternary nitride semiconductor. The fourth semiconductor layer 36 may be formed of the same material as that of the third semiconductor layer 35 of the barrier layer 32. For example, the fourth semiconductor layer 36 may be formed of AlN.

The thickness of the fourth semiconductor layer 36 may be equal to the thickness T4 of the third semiconductor layer 35 and may be in the range of 1 nm to 10 nm. For example, the fourth semiconductor layer 36 may have a thickness in the range of 1 nm to 4 nm. The second to fourth semiconductor layers 34 to 36 of the barrier layer 32 may be formed of the same AlN material and may have the same thickness.

The energy bandgap of the fourth semiconductor layer 36 may be wider than that of the first conductive semiconductor layer 117. As another example, the energy bandgap of the fourth semiconductor layer 36 may be equal to that of the first conductive semiconductor layer 117.

Since the fourth semiconductor layer 36 and the second semiconductor layer 34 of the barrier layer 32 are disposed on the bottom and top surfaces of the first well layer W1, the barrier height of the first well layer W1 may be increased and the polarization may be relieved.

Figure 8:
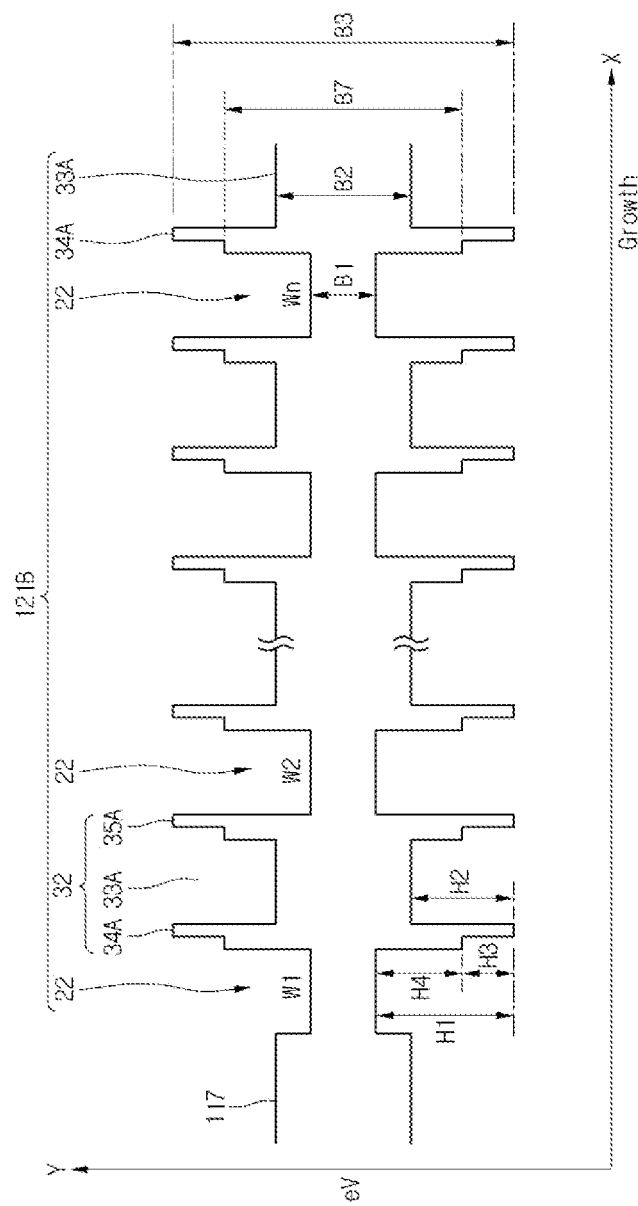
FIG. 8 is an energy band diagram of an active layer according to the third embodiment.

FIG. 8 is an energy band diagram of an active layer according to the third embodiment.

Referring to FIG. 8, the active layer 121B includes a plurality of well layers 22 and a plurality of barrier layers 32, and each of the barrier layer 32 disposed between the well layers 22 includes the first to third semiconductor layers 33A to 35A.

The second and third semiconductor layers 34A and 35A are formed of an AlN material, the Al composition ratio of which is linearly or non-linearly increased.

The Al composition ratio or content in a lower region of the second semiconductor layer 34A adjacent to the first well layer W1 is less than the Al composition ratio or content of an upper region adjacent to the first semiconductor layer 33A. Thus, when seeing the energy bandgap of the second semiconductor layer 34A, the energy bandgap B7 of the region adjacent to the first well layer W1 in each of the barrier layer 32 may be narrower than the energy bandgap B3 of the region adjacent to the first semiconductor layer 33A.

Further, when seeing the barrier height of the second semiconductor layer 34A, the lower region adjacent to the first well layer W1 among the regions of the second semiconductor layer 34A has a barrier height H4 lower than the barrier height H1 of the upper region adjacent to the first semiconductor layer 33A and the barrier height H2 of the first semiconductor layer 33A in each of the barrier layer 32.

The Al composition ratio or content of the lower region of the third semiconductor layer 35A adjacent to the first semiconductor layer 35A is less than the Al composition ratio or content of the upper region adjacent to the second well layer W2. Thus, the energy bandgap B7 of the region in the third semiconductor layer 35A adjacent to the first semiconductor layer 33A may be narrower than the energy bandgap B3 of the region adjacent to the second well layer W2 in each of the barrier layer 32.

As described above, by linearly or non-linearly increasing the Al composition ratios of the second and third semiconductor layers 34A and 35A, the electron blocking efficiency of the first semiconductor layer 24A may be improved.

A barrier height difference between the lower and upper regions of each of the second and third semiconductor layers 34A and 35A may exist. That is, the barrier heights of the lower regions of the second and third semiconductor layers 34A and 35A are higher than those of the upper regions of them. To the contrary, the barrier heights of the upper regions of the second and third semiconductor layers 34A and 35A are higher than those of the lower regions of them. According to another embodiment, a difference between the thicknesses of the lower and upper regions of each of the second and third semiconductor layers 34A and 35A may exist.

Figure 9:
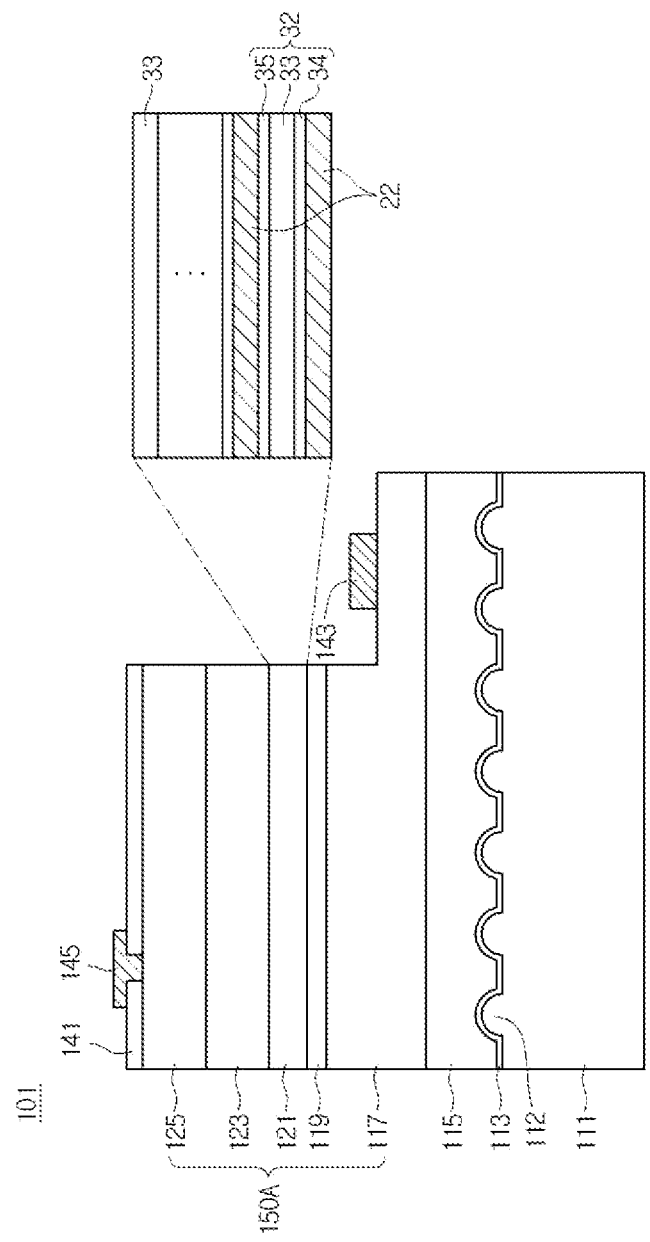
FIG. 9 is a view showing another example of the light emitting device shown in FIG. 1.

FIG. 9 is a view showing another embodiment of the light emitting device in FIG. 1. Refer to the description of FIGS. 1 to 3 for the same parts of FIG. 9, Referring to FIG. 9, the light emitting device 101 may include a substrate 111, a buffer layer 113, a low-conductive layer 115, a first conductive semiconductor layer 117, a clad layer 119, an active layer 121, an electron blocking layer 123, and a second conductive semiconductor layer 125.

A plurality of protrusions 112 may be formed on the top surface of the substrate 111 and the plurality of protrusions 112 may be formed in a light extracting structure.

The buffer layer 113 may be formed on the substrate 111. The buffer layer 113 may be prepared as at least one layer by using a group II-VI or a group III to V compound semiconductor. The buffer layer 113 may include a semiconductor layer formed by using the group III-V compound semiconductor. For instance, the buffer layer 113 may include at least one of compound semiconductors having the compositional formula of $In_xAl_yGa_{1-x-y}N$ (0≤x≤1, 0≤y≤1, 0≤x+y≤1), such as GaN, InN, AlN, InGaN, AlGaN, InAlGaN, and AlInN. The buffer layer 113 may have the super-lattice structure by alternately stacking heterogeneous semiconductor layers.

The buffer layer 113 may attenuate the lattice mismatch between the substrate 111 and the nitride semiconductor layer and may be defined as a defect control layer. The buffer layer 113 may have a lattice constant between a lattice constant of the substrate 11 and a lattice constant of the nitride semiconductor layer. The buffer layer 113 may be formed by using oxide, such as ZnO, but the embodiment is not limited thereto. The buffer layer 113 may have a thickness in the range of 30 nm to 500 nm, but the embodiment is not limited thereto.

The low-conductive layer 115 is formed on the buffer layer 113. The low-conductive layer 115 includes an undoped semiconductor layer having conductivity lower than that of the first conductive semiconductor layer 117. The low-conductive layer 115 can be formed by using the group III-V compound semiconductor, for instance, a GaN-based semiconductor. The undoped semiconductor layer has a first conductive property even if a conductive dopant is not intentionally doped thereto. The undoped semiconductor layer may not be formed, and the embodiment is not limited thereto.

The first conductive semiconductor layer 117 may be formed on the low-conductive layer 115. The details of the first conductive semiconductor layer 117 refer to the description about the first embodiment. The heterogeneous first and second semiconductor layers may be formed in a superlattice structure in which the first and second layers are alternately disposed between the low-conductive layer 115 and the first conductive semiconductor layer 117. Each of the first and second layers may have a thickness of about several Å or above.

The clad layer 119 is disposed on the first conductive semiconductor layer 117, and the active layer 121 is disposed on the clad layer 119. The clad layer 119 may include a GaN-based semiconductor and may confine carriers. According to another embodiment, the clad layer 119 may have the superlattice structure of InGaN or InGaN/GaN, but the embodiment is not limited thereto. The clad layer 119 may include N type and/or P type dopant. For instance, the clad layer 119 may be prepared as a first conductive semiconductor layer or a low-conductive semiconductor layer.

The active layer 121 refers to the description about FIGS. 1 to 3 disclosed above. Since the clad layer 119 is disposed below the active layer 121, the clad layer 119 may be disposed between the first well layer W1 of the active layer 121 and the first conductive semiconductor layer 117 in FIG. 2. The energy bandgap of the clad layer 119 may be wider than the energy bandgap of the barrier layer 32, that is, at least one of the first to third semiconductor layers 33 to 35. For example, the energy bandgap of the clad layer 119 may be wider than that of the first semiconductor layer 33 and narrower than those of the second and third semiconductor layers 34 and 35.

The electron blocking layer 123 may be formed on the active layer 121. The electron blocking layer 123 may be formed to have an energy bandgap wider than that of the second barrier layer 24 of the active layer 121. The electron blocking layer 123 may be formed of a group III-V compound semiconductor such as an AlGaN semiconductor as a GaN based semiconductor. At least one of the first to third semiconductor layers 33 to 35 may be disposed in the barrier layer adjacent to the electron blocking layer 123. For example, the second and third semiconductor layers 34 and 35 may be disposed in the barrier layer adjacent to the electron blocking layer 123, but the embodiment is not limited thereto.

The second conductive semiconductor layer 125 is formed on the electron blocking layer 123 and refers to the description about the first embodiment. The growing temperature is increased in order to grow the electron blocking layer 123 while the last quantum well structure of the active layer 121 is being grown. In this case, by increasing the growing temperature, the thin film property may be improved.

The light emitting structure 150A may include a layer structure ranging from the first conductive semiconductor layer 117 to the second conductive semiconductor layer 125.

The electrode layer 141 and the second electrode 145 are formed on the light emitting structure 150A, and the first electrode 143 is formed on the first conductive semiconductor layer 117.

The electrode layer 141, which serves as a current diffusion, may be formed of a material having permeability and electrical conductivity. The electrode layer 141 may be formed to have a refractive index less than that of the compound semiconductor layer. The electrode layer 141 is formed on the top surface of the second conductive semiconductor layer 125. The electrode layer 141 may be formed of a material selected from the group consisting of ITO (indium tin oxide), IZO(indium zinc oxide), IZTO(indium zinc tin oxide), IAZO(indium aluminum zinc oxide), IGZO (indium gallium zinc oxide), IGTO(indium gallium tin oxide), AZO(aluminum zinc oxide), ATO(antimony tin oxide), GZO(gallium zinc oxide), ZnO, IrOx, RuOx, and NiO, and may include at least one layer. The electrode layer 141 may include a reflective electrode layer. The electrode layer 141 may include one selected from the group consisting of Al, Ag, Pd, Rh, Pt, Ir and an alloy having at least two of the above elements.

The second electrode 145 may be formed on the second conductive semiconductor layer 125 and/or the electrode layer 141, and may include an electrode pad. The second electrode 145 may form a current diffusion pattern of an arm structure or a finger structure. The second electrode 145 may be formed of a metal having properties of an ohmic contact, an adhesive layer and a bonding layer and may have non-transmissive material property, but the embodiment is not limited thereto.

The first electrode 143 may be formed on the exposed region of the first conductive semiconductor layer 117. The first and second electrodes 143 and 145 may include one selected from the group consisting of Ti, Ru, Rh, Ir, Mg, Zn, Al, In, Ta, Pd, Co, Ni, Si, Ge, Ag, Au, and an alloy thereof.

An insulation layer may be further formed on the surface of the light emitting device 101, so that the insulation layer may prevent an electrical short of the layers of the light emitting structure 150A and moisture infiltration.

Figure 10:
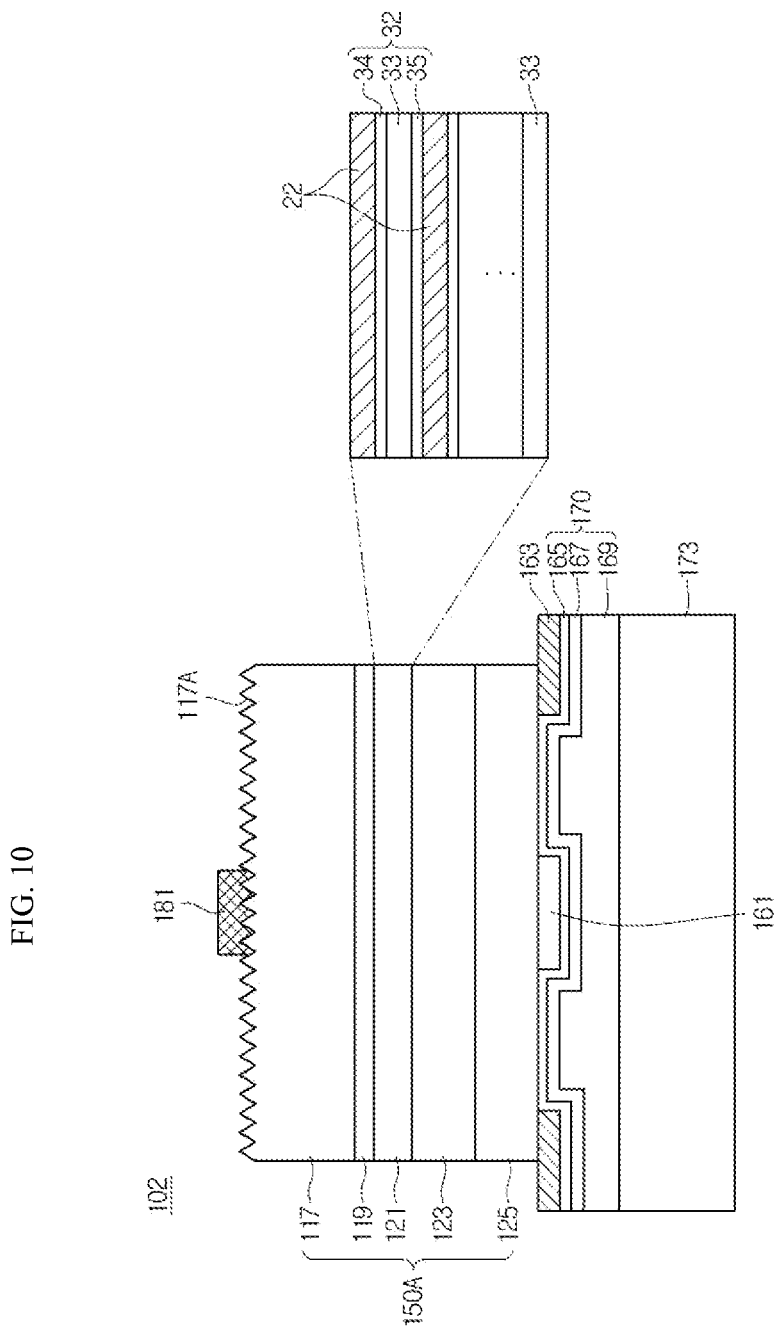
FIG. 10 is a sectional view showing another example of a light emitting device shown in FIG. 1.

FIG. 10 is a sectional view showing another example of a light emitting device in FIG. 1.

Referring to FIG. 10, the light emitting device includes a current blocking layer 161, a channel layer 163, a second electrode 170 and a supporting member 173 below the light emitting structure 150. The current blocking layer 161 may include at least one of $SiO_2$, $SiO_x$, $SiO_xN_y$, $Si_3N_4$, $Al_2O_3$ and $TiO_2$ as an insulation material. For example, at least one current blocking layer 161 may be formed between the light emitting structure 150A and the second electrode 170.

The current blocking layer 161 is disposed in the thickness direction of the first electrode 143 disposed on the light emitting structure 150A and the light emitting structure 150A. The current blocking layer 161 blocks the current provided from the second electrode 170, so that the current may be diffused in other paths. According to another example, the current blocking layer 161 may be formed of a metallic material that makes Schottky contact with the lower surface of the second conductive semiconductor layer 125, but the embodiment is not limited thereto.

The channel layer 163 may be disposed around the bottom surface of the second conductive semiconductor layer 125, and may be formed in a ring shape, a loop shape or a frame shape. The channel layer 163 may be formed of a material selected from a conductive material, a non-conductive material and an insulation material. The channel layer 163 may include at least one of ITO, IZO, IZTO, IAZO, IGZO, IGTO, AZO, ATO, $SiO_2$, $SiO_x$, $SiO_xN_y$, $Si_3N_4$, $Al_2O_3$, and $TiO_2$. The channel layer 163 may be formed of metal, but the embodiment is not limited thereto. The inner side portion of the channel layer 163 makes contact with the circumference of the lower surface region of the second conductive semiconductor layer 125, and the outer side portion of the channel layer 163 is disposed outward of the side surface of the light emitting structure 150A.

The second electrode 170 may be formed below the second conductive semiconductor layer 125. The second electrode may include a plurality of conductive layers 165, 167 and 169.

The second electrode 170 includes a contact layer 165, a reflective layer 167 and a bonding layer 169. The contact layer 165 may be formed of metal or a metallic material which makes ohmic contact with a bottom surface of the second conductive semiconductor layer 125. The contact layer 165 may be formed by using a low-conductive material such as ITO, IZO, IZTO, IAZO, IGZO, IGTO, AZO or ATO, or metal such as Ni or Ag. The reflective layer 167 may be formed below the contact layer 165. The reflective layer 167 may be formed of a structure having at least one layer including a material selected from the group consisting of Ag, Ni, Al, Rh, Pd, Ir, Ru, Mg, Zn, Pt, Au, Hf and combination thereof. The reflective layer 167 may make contact with a lower surface of the second conductive semiconductor layer 125. The reflective layer 167 may make ohmic contact with the second conductive semiconductor layer 125 by using metal or a low-conductive material such as ITO.

The bonding layer 169 may be formed below the reflective layer 167. The bonding layer 169 may be formed by using barrier or bonding metal. The bonding layer 169 may include at least one of Ti, Au, Sn, Ni, Cr, Ga, In, Bi, Cu, Ag, Ta and alloy thereof.

The supporting member 173 is formed below the bonding layer 169. The supporting member 173 may be formed of a conductive material such as Cu, Au, Ni, Mo, Cu—W, or a carrier wafer (for example, Si, Ge, GaAs, ZnO, SiC, etc.). As another example, the supporting member 173 may be realized by using a conductive sheet.

The substrate in FIG. 1 or 5, the growth substrate is removed. The growth substrate may removed through a physical scheme (for example, laser lift off scheme) and/or a chemical scheme (for example, wet etching scheme), so that the first conductive semiconductor layer 117 may be exposed. The first electrode 181 is formed on the first conductive semiconductor layer 117 by performing an isolation etching process in the direction of removing the growth substrate.

A light extracting structure 117 such as a roughness may be formed on the top surface of the first conductive semiconductor layer 117.

Thus, the light emitting device 102, which includes the first electrode 143 on the light emitting structure 150A and the supporting member 173 below the light emitting structure 150A in a vertical electrode structure, may be fabricated.

The embodiment may provide a novel active layer so that the quantum efficiency in the active layer may be improved.

The embodiment provides the active layer which may improve the carrier confinement efficiency. The embodiment may improve the recombination rate of electrons and holes so that the luminous intensity may be improved.

Figure 11:
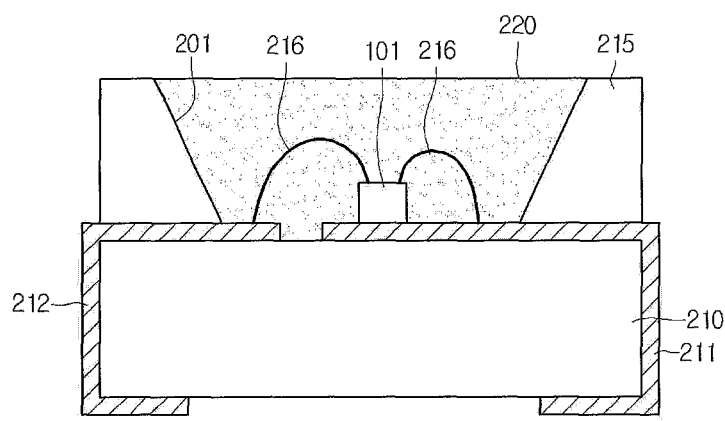
FIG. 11 is a view showing a semiconductor light-emitting package having the light emitting device shown in FIG. 5.

FIG. 11 is a view showing a semiconductor light-emitting package having the light emitting device of FIG. 9.

Referring to FIG. 11, the semiconductor light-emitting package 200 includes a body 210; first and second lead electrodes 211 and 212, at least portions of which are disposed in the body 210, a light-emitting device 101 electrically connected to the first and second lead electrodes 211 and 212 on the body 210, and a molding member 220 surrounding the light-emitting device 101.

The body 210 may be formed of at least one of a silicon material, a synthetic resin material and a metallic material. The body 210 may include a cavity 205 formed therein and a reflective portion 215 having an inclined surface at the periphery thereof.

The first lead electrode 211 and the second lead electrode 212 are electrically disconnected from each other, and are formed to pass through the body 210. That is, the inner side portions of the first and second lead electrodes 211 and 212 may be disposed in the cavity 201 and the other portions of the first and second lead electrodes 211 and 212 may be disposed at an outside of the body 210.

The first lead electrode 211 and the second lead electrode 212 provide power to the light-emitting device 100 Also, the first lead electrode 211 and the second lead electrode 212 reflect the light emitted from the light-emitting device 100, thus improving the light emitting efficiency. Also, the first lead electrode 211 and the second lead electrode 212 may serve to discharge the heat generated from the light-emitting device 101.

The light-emitting device 101 may be disposed on the body 210, or may be formed on the first lead electrode 211 and/or the second lead electrode 212.

The wire 216 of the light emitting device 101 may be electrically connected to at least one of the first and second lead electrodes 211 and 212, but the embodiment is not limited thereto.

The molding member 220 may surround the light-emitting device 101 to protect the light-emitting device 101. Also, the molding member 220 may include a fluorescent material to change the wavelength of light emitted from the light-emitting device 101.

<Lighting System>

The light emitting device according to the embodiment is applicable to a lighting system. The lighting system includes a structure in which plurality of light emitting devices are arrayed. The lighting system includes a display apparatus shown in FIGS. 12 and 13, a lighting apparatus shown in FIG. 14, a lighting lamp, a camera flash, a signal lamp, a headlamp for a vehicle, and an electronic display.

Figure 12:
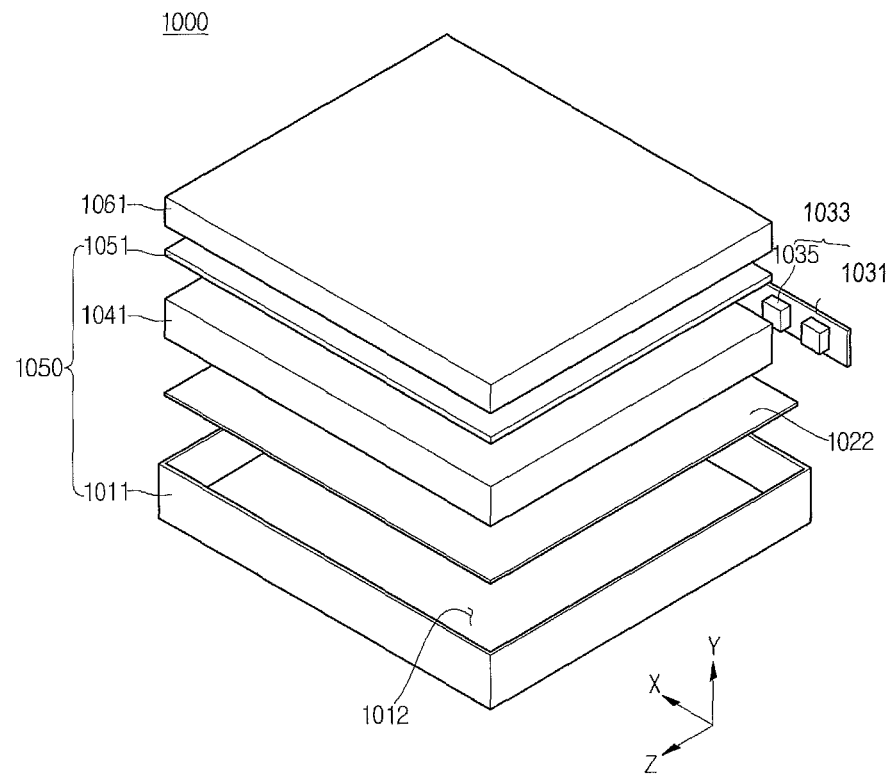
FIG. 12 is a view showing a display device having a light emitting device or a light emitting device package according to the embodiment.

FIG. 12 is an exploded perspective view showing a display apparatus having the light emitting device according to the embodiment.

Referring to FIG. 12, a display apparatus 1000 according to the embodiment includes a light guide plate 1041, a light source module 1033 to supply light to the light guide plate 1041, a reflective member 1022 under the light guide plate 1041, an optical sheet 1051 on the light guide plate 1041, a display panel 1061 on the optical sheet 1051, and a bottom cover 1011 to receive the light guide plate 1041, the light source module 1033, and the reflective member 1022, but the embodiment is not limited thereto.

The bottom cover 1011, the reflective sheet 1022, the light guide plate 1041, the optical sheet 1051, and the light unit 1050 may be defined as a back light unit.

The light guide plate 1041 diffuses the light supplied from the light source module 1033 to provide surface light. The light guide plate 1041 may include a transparent material. For example, the light guide plate 1041 may include one of acryl-based resin, such as PMMA (polymethyl methacrylate, PET (polyethylene terephthalate), PC (polycarbonate), COC (cyclic olefin copolymer) and PEN (polyethylene naphthalate) resin.

The light source module 1033 is disposed on at least one side of the light guide plate 1041 to supply the light to at least one side of the light guide plate 1041. The light source module 1033 serves as the light source of the display device.

At least one light source module 1033 is disposed to directly or indirectly supply the light from one side of the light guide plate 1041. The light source module 1033 may include a board 1031 and the light emitting device according to the embodiments or the light emitting device 1035. The light emitting device or the light emitting device 1035 are arranged on the board 1031 while being spaced apart from each other at the predetermined interval.

The board 1031 may include a printed circuit board (PCB) including a circuit pattern (not shown). In addition, the board 1031 may also include a metal core PCB (MCPCB) or a flexible PCB (FPCB) as well as a typical PCB, but the embodiment is not limited thereto. If the light emitting device 1035 is installed on the side of the bottom cover 1011 or on a heat dissipation plate, the board 1031 may be omitted. The heat dissipation plate partially makes contact with the top surface of the bottom cover 1011.

In addition, the light emitting device 1035 are arranged such that light exit surfaces to discharge light of the light emitting device 1035 are spaced apart from the light guide plate 1041 by a predetermined distance on the board 1031, but the embodiment is not limited thereto. The light emitting device 1035 may directly or indirectly supply the light to a light incident surface, which is one side of the light guide plate 1041, but the embodiment is not limited thereto.

The reflective member 1022 is disposed below the light guide plate 1041. The reflective member 1022 reflects the light, which is traveled downward through the bottom surface of the light guide plate 1041, toward the display panel 1061, thereby improving the brightness of the light unit 1050. For example, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light source module 1033, and the reflective member 1022 therein. To this end, the bottom cover 1011 has a receiving section 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for example, is an LCD panel including first and second transparent substrates, which are opposite to each other, and a liquid crystal layer interposed between the first and second substrates. A polarizing plate can be attached to at least one surface of the display panel 1061, but the embodiment is not limited thereto. The display panel 1061 displays information by allowing the light to pass therethrough. The display device 1000 can be applied to various portable terminals, monitors of notebook computers, monitors or laptop computers, and televisions.

The optical sheet 1051 is disposed between the display panel 1061 and the light guide plate 1041 and includes at least one transmissive sheet. For example, the optical sheet 1051 includes at least one selected from the group consisting of a diffusion sheet, a horizontal and vertical prism sheet, and a brightness enhanced sheet. The diffusion sheet diffuses the incident light, the horizontal and vertical prism sheet concentrates the incident light onto the display panel 1061, and the brightness enhanced sheet improves the brightness by reusing the lost light. In addition, a protective sheet can be disposed on the display panel 1061, but the embodiment is not limited thereto.

The light guide plate 1041 and the optical sheet 1051 can be disposed in the light path of the light source module 1033 as optical members, but the embodiment is not limited thereto.

Figure 13:
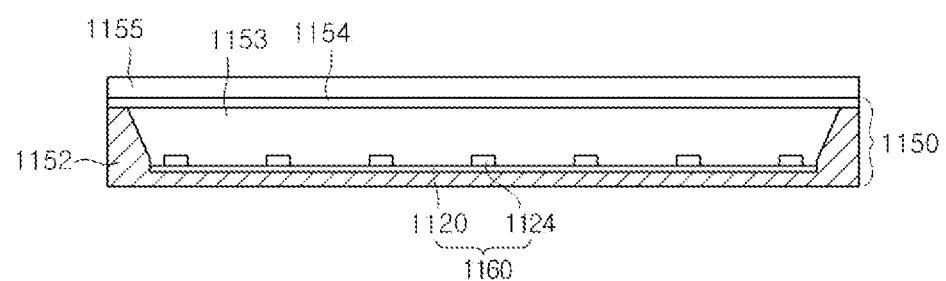
FIG. 13 is a view showing an another example of a display device having a light emitting device or a light emitting device package according to the embodiment.

FIG. 13 is a sectional view showing a display apparatus according to the embodiment.

Referring to FIG. 13, the display device 1100 includes a bottom cover 1152, a board 1120 on which the light emitting device 1124 are arrayed, an optical member 1154, and a display panel 1155.

The board 1120 and the light emitting device 1124 may constitute the light source module 1160. In addition, the bottom cover 1152, at least one light source module 1160, and the optical member 1154 may constitute the light unit 1150. The bottom cover 1151 can be disposed with a receiving section 1153, but the embodiment is not limited thereto. The light source module 1160 includes a board 1120, and a plurality of light emitting devices arranged on the board 1120 or a light emitting device 1124.

The optical member 1154 may include at least one selected from the group consisting of a lens, a light guide plate, a diffusion sheet, a horizontal and vertical prism sheet, and a brightness enhanced sheet. The light guide plate may include PC or PMMA (Poly methyl methacrylate). The light guide plate can be omitted. The diffusion sheet diffuses the incident light, the horizontal and vertical prism sheet concentrates the incident light onto a display region, and the brightness enhanced sheet improves the brightness by reusing the lost light.

The optical member 1154 is disposed above the light source module 1160 in order to convert the light emitted from the light source module 1160 into the surface light.

Figure 14:
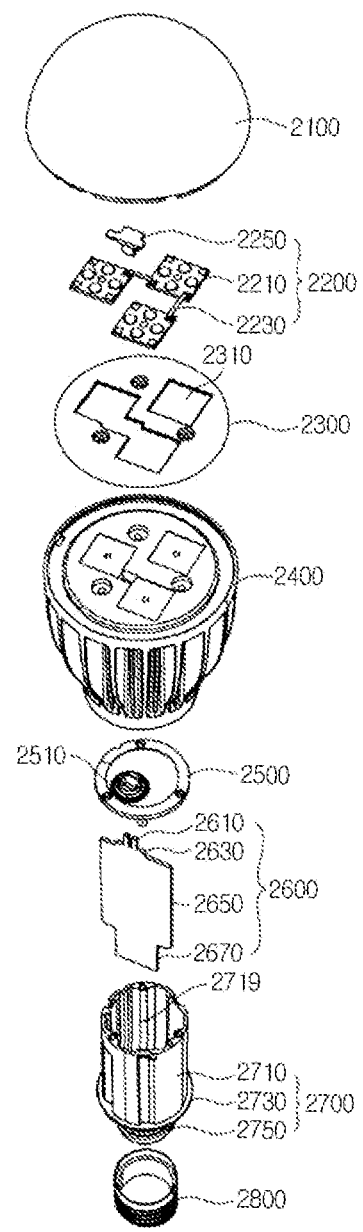
FIG. 14 is a view showing a lighting apparatus having a light emitting device or a light emitting device package according to the embodiment.

FIG. 14 is an exploded perspective view showing a lighting device having the light emitting device according to the embodiment.

Referring to FIG. 14, the lighting device according to the embodiment may include a cover 2100, a light source module 2200, a heat radiation member 2400, a power supply part 2600, an inner case 2700, and a socket 2800. In addition, the light emitting device according to the embodiment may further include at least one of a member 2300 and a holder 2500. The light source module 2200 may include the light emitting device according to the embodiment.

For example, the cover 2100 has the shape of a bulb, or a hemispherical shape. The cover 2100 may have a hollow structure, and a portion of the cover 2100 may be open. The cover 2100 may be optically connected to the light source module 2200, and may be coupled with the heat radiation member 2400. The cover 2100 may have a recess part coupled with the heat radiation member 2400.

The inner surface of the cover 2100 may be coated with ivory white pigments serving as a diffusing agent. The light emitted from the light source module 2200 may be scattered or diffused by using the ivory white material, so that the light can be discharged to the outside.

The cover 2100 may include glass, plastic, PP, PE, or PC. In this case, the PC represents superior light resistance, superior heat resistance, and superior strength. The cover 2100 may be transparent so that the light source module 2200 may be recognized at the outside. In addition, the cover 2100 may be opaque. The cover 2100 may be formed through a blow molding scheme.

The light source module 2200 may be disposed at one surface of the heat radiation member 2400. Accordingly, the heat emitted from the light source module 2200 is conducted to the heat radiation member 2400. The light source module 2200 may include a light emitting device 2210, a connection plate 2230, and a connector 2250.

The member 2300 is disposed on the top surface of the heat radiation member 2400, and has a guide groove 2310 having a plurality of light emitting devices 2210 and a connector 2250 inserted into the guide groove 2310. The guide groove 2310 corresponds to the substrate of the light emitting device 2210 and the connector 2250.

White pigments may be applied to or coated on the surface of the member 2300. The member 2300 reflects light, which reflected by the inner surface of the cover 2100 to return to the light source module 2200, toward the cover 2100. Accordingly, the light efficiency of the lighting apparatus according to the embodiment can be improved.

The member 2300 may include an insulating material. The connection plate 2230 of the light source module 2200 may include an electric-conductive material. Accordingly, the heat radiation member 2400 may be electrically connected to the connection plate 2230. The member 2300 includes an insulating material to prevent the electrical short between the connection plate 2230 and the heat radiation member 2400. The heat radiation member 2400 receives heat from the light source module 2200 and the heat from the power supply part 2600 and radiates the heats.

The holder 2500 blocks a receiving groove 2719 of an insulating part 2710 disposed in an internal case 2700. Accordingly, the power supply part 2600 received in the insulating part 2710 of the internal case 2700 is sealed. The holder 2500 has a guide protrusion part 2510. The guide protrusion part 2510 may include a hole allowing a protrusion part 2610 of the power supply part 2600 to pass therethrough.

The power supply part 2600 processes and transforms an electrical signal received from the outside and supplies the electrical signal to the light source module 2200. The power supply part 2600 is received in the receiving groove 2719 of the internal case 2700, and sealed in the internal case 2700 by the holder 2500.

The power supply part 2600 may include a protrusion part 2610, a guide part 2630, a base 2650, and an extension part 2670.

The guide part 2630 protrudes outward from one side of the base 2650. The guide part 2630 may be inserted into the holder 2500. A plurality of parts may be disposed on one surface of the base 2650. For example, the parts include a DC converter, a driving chip to drive the light source module 2220, and an ESD (electrostatic discharge) protective device to protect the light source module 2200, but the embodiment is not limited thereto.

The extension part 2670 protrudes outward from another side of the base 2650. The extension part 2670 is inserted into the connection part 2750 of the internal case 2700, and receives an electrical signal from the outside. For example, the extension part 2670 may be equal to or less than the width of the connection part 2750 of the internal case 2700. The extension part 2670 may be electrically connected to the socket 2800 through a wire.

The internal case 2700 may be disposed therein with a molding part together with the power supply part 2600. The molding part is formed by hardening a molding liquid, so that the power supply part 2600 may be fixed into the internal case 2700.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a first conductive semiconductor layer;
   a second conductive semiconductor layer on the first conductive semiconductor layer; and
   an active layer between the first and second conductive semiconductor layers, the active layer including a plurality of well layers and a plurality of barrier layers,
   wherein the plurality of well layers has a first well layer and a second well layer adjacent to the first well layer,
   wherein the plurality of barrier layers has a first barrier layer disposed between the first and second well layers,
   wherein the first barrier layer has a plurality of semiconductor layers having an energy bandgap wider than an energy bandgap of the first well layer,
   wherein at least two layers of the plurality of semiconductor layers which are adjacent to the first and second well layers have aluminum contents greater than that of another layer of the plurality of semiconductor layers,
   wherein the other layer of the plurality of semiconductor layers is formed of a ternary or quaternary compound semiconductor including aluminum (Al) and nitrogen (N),
   wherein the at least two layers of the plurality of semiconductor layers are formed of a binary compound semiconductor including aluminum (Al),
   wherein the active layer emits light having a wavelength of 385 nm or less,
   wherein the first and second well layers are formed of a gallium nitrogen (GaN) layer, and wherein a thickness of each of the at least two layers of the plurality of semiconductor layers is thinner than a thickness of each of the first and second well layers.

2. The light emitting device of claim 1, wherein the thickness of each of the at least two layers of the plurality of semiconductor layers is thinner than that of the other layer of the plurality of semiconductor layers and wherein the thickness of each of the at least two layers of the plurality of semiconductor layers is in a range of 1 nm to 4 nm.

3. The light emitting device of claim 1, wherein the at least two layers of the plurality of semiconductor layers have energy bandgaps wider than that of the other of the plurality of semiconductor layers, and
wherein the at least two layers of the plurality of semiconductor layers contact the other layer.

4. The light emitting device of claim 3, wherein the at least two layers of the plurality of semiconductor layers have a barrier height higher than that of the other layer of the plurality of semiconductor layers,
wherein the at least two layers of the plurality of semiconductor layers are formed of an AlN layer, and
wherein the other layer of the plurality of semiconductor layers is formed of an AlGaN layer.

5. The light emitting device of claim 1, wherein the at least two layers of the plurality of semiconductor layers have a lattice constants smaller than that of the other of the plurality of semiconductor layers,
wherein the at least two layers of the plurality of semiconductor layers are formed of an AlN layer, and
wherein the other layer of the plurality of semiconductor layers is formed of an AlGaN layer.

6. The light emitting device of claim 1, wherein the plurality of semiconductor layers comprise:
a first semiconductor layer having a second energy bandgap wider than a first energy bandgap of the first well layer;
a second semiconductor layer between the first well layer and the first semiconductor layer, the second semiconductor layer having a third energy bandgap wider than the second energy bandgap; and
a third semiconductor layer between the first semiconductor layer and the second well layer, the third semiconductor layer having a fourth energy bandgap wider than the second energy bandgap,
wherein the second and third semiconductor layers are formed of an AlN layer, and
wherein the first semiconductor layer is formed of an AlGaN layer,
wherein the second semiconductor layer contacts the first well layer and the third semiconductor layer contact the second well layer, and
wherein the first semiconductor layer contacts the second and third semiconductor layers.

7. The light emitting device of claim 6, wherein each of the second and third semiconductor layers has a thickness thinner than a thickness of the first well layer, and
wherein the thickness of each of the second and third semiconductor layers is in a range of 1 nm to 4 nm.

8. The light emitting device of claim 7, wherein a difference of a thickness of the first semiconductor layer and the thickness of the first well layer is less than a difference of the thickness of the second semiconductor layer and the thickness of the first semiconductor layer.

9. The light emitting device of claim 7, wherein the second and third semiconductor layers includes a material having a lattice constant less than a lattice constant of the first semiconductor layer, and the aluminum content of the first semiconductor layer is in the range of 5% to 10%.

10. The light emitting device of claim 7, wherein the thickness of the second semiconductor layer is equal to the thickness of the third semiconductor layer.

11. The light emitting device of claim 1, wherein the first conductive semiconductor layer includes AlGaN and the second conductive semiconductor layer includes AlGaN, and wherein the active layer emits a UV light having a peak wavelength of 285 nm to 385 nm.

12. The light emitting device of claim 1, wherein at least one of the plurality of semiconductor layers has a first region and a second region, the first region having an Al composition ratio less than an Al composition ratio of the second region, wherein the first well layer is closer to the first conductive semiconductor layer than to the second well layer, and wherein the first region is closer to the first well layer than to the second region.

13. A light emitting device comprising:
a first conductive semiconductor layer including an n type dopant;
a second conductive semiconductor layer on the first conductive semiconductor layer, the second conductive semiconductor layer including a p type dopant;
an active layer between the first and second conductive semiconductor layers, the active layer including a plurality of well layers and a plurality of barrier layers; and
an electron blocking layer between the active layer and the second conductive semiconductor layer,
wherein the plurality of well layers comprise a first well layer and a second well layer adjacent to the first well layer,
wherein the plurality of barrier layers comprise a first barrier layer disposed between the first and second well layers,
wherein the first barrier layer comprises a plurality of semiconductor layers having an energy bandgap wider than an energy bandgap of the first well layer,
wherein at least two layers of the plurality of semiconductor layers which are adjacent to the first and second well layers have lattice constants smaller than that of another layer of the plurality of semiconductor layers, and
wherein the at least two layers of the plurality of semiconductor layers have aluminum contents greater than that of the other layer of the plurality of semiconductor layers,
wherein the other layer of the plurality of semiconductor layers is formed of a ternary or quaternary compound semiconductor including aluminum (Al) and nitrogen (N),
wherein the at least two layers of the plurality of semiconductor layers are formed of a binary compound semiconductor including aluminum (Al) and contact the other layer, and
wherein the active layer emits light having a wavelength of 385 nm or less,
wherein the first well layer is closer to the first conductive semiconductor layer than to the second well layer,
wherein at least one of the plurality of semiconductor layers includes a first region and a second region, the first region having an Al composition ratio less than an Al composition ratio of the second region,
wherein the first region is closer to the first well layer than to the second region,
wherein the first and second well layers are formed of an aluminum-gallium-nitrogen (AlGaN) layer, and wherein a thickness of each of the at least two layers of the plurality of semiconductor layers is thinner than a thickness of each of the first and second well layers.

14. The light emitting device of claim 13, wherein the plurality of semiconductor layers comprise:
a first semiconductor layer having a second energy bandgap wider than a first energy bandgap of the first well layer;
a second semiconductor layer between the first well layer and the first semiconductor layer, the second semiconductor layer having a third energy bandgap wider than the second energy bandgap; and
a third semiconductor layer between the first semiconductor layer and the second well layer, the third semiconductor layer having a fourth energy bandgap wider than the second energy bandgap, and
wherein the second and third semiconductor layers have thicknesses thinner than a thickness of the first well layer,
wherein the first semiconductor layer is formed of an AlGaN layer.

15. The light emitting device of claim 14, wherein a second barrier layer adjacent to the electron blocking layer and a third barrier layer adjacent to a top surface of the first conductive semiconductor layer comprise AN material.

16. The light emitting device of claim 14, wherein a second barrier layer closest to the electron blocking layer comprises an AlN/AlGaN barrier structure, and
wherein a thickness of an AlN layer of the AlN/AlGaN barrier structure is thinner than a thickness of the first well layer.

17. A light emitting device comprising:
a first conductive semiconductor layer;
a second conductive semiconductor layer on the first conductive semiconductor layer; and
an active layer between the first and second conductive semiconductor layers, the active layer including a plurality of well layers and a plurality of barrier layers,
wherein the plurality of well layers has a first well layer and a second well layer adjacent to the first well layer,
wherein the plurality of barrier layers has a first barrier layer disposed between the first and second well layers,
wherein the first barrier layer has a plurality of semiconductor layers having an energy bandgap wider than an energy bandgap of the first well layer,
wherein the plurality of the semiconductor layers of the first barrier layer includes a first semiconductor layer between the first and second well layer, a second semiconductor layer between the first semiconductor layer and the first well layer, and a third semiconductor layer between the first semiconductor layer and the second well layer,
wherein the first semiconductor layer is formed of an AlGaN layer,
wherein each of the second and third semiconductor layer is formed of an AlN layer and contacts the first semiconductor layer,
wherein the active layer emits light having a wavelength of 385 nm or less,
wherein the first and second well layer layers are formed of an AlGaN layer,
wherein the second and third semiconductor layers have thicknesses thinner than a thickness of the first well layer,
and
wherein the thickness of each of the second and third semiconductor layers is in a range of 1 nm to 4 nm.

* * * * *